US012531330B1

(12) United States Patent
Gok et al.

(10) Patent No.: US 12,531,330 B1
(45) Date of Patent: Jan. 20, 2026

(54) OSCILLATOR INTEGRATED PIEZOELECTRIC RADIATOR

(71) Applicant: Rockwell Collins, Inc., Cedar Rapids, IA (US)

(72) Inventors: Gurkan Gok, Milford, CT (US); Joseph Zacchio, Wethersfield, CT (US); Jeffrey Box, Farmersville, TX (US); Kenneth Keese, Lavon, TX (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 86 days.

(21) Appl. No.: 18/433,182

(22) Filed: Feb. 5, 2024

(51) Int. Cl.

| | |
|---|---|
| ***H03B 5/32*** | (2006.01) |
| ***H01Q 1/38*** | (2006.01) |
| ***H01Q 1/42*** | (2006.01) |
| ***H01Q 5/20*** | (2015.01) |

(52) U.S. Cl.
CPC ................ *H01Q 1/38* (2013.01); *H01Q 1/42* (2013.01); *H01Q 5/20* (2015.01); *H03B 5/32* (2013.01); *H03B 2200/0012* (2013.01)

(58) Field of Classification Search
CPC .. H01Q 1/38; H01Q 5/20; H01Q 1/50; H01Q 1/36; H01Q 1/364; H01Q 9/04; H01Q 1/42; H03B 5/32; H03B 2200/0012
See application file for complete search history.

(56) References Cited

U.S. PATENT DOCUMENTS

| | | | |
|---|---|---|---|
| 6,208,063 | B1 | 3/2001 | Horikawa et al. |
| 6,806,846 | B1 | 10/2004 | West |
| 6,894,616 | B1 | 5/2005 | Forster |
| 7,012,271 | B2 | 3/2006 | Gorinevsky et al. |
| 7,046,198 | B2 | 5/2006 | Sakiyama et al. |
| 7,298,217 | B2 | 11/2007 | Adlerstein et al. |
| 7,619,574 | B1 | 11/2009 | West |

(Continued)

FOREIGN PATENT DOCUMENTS

| | | | |
|---|---|---|---|
| CN | 112993523 A * | 6/2021 | ............... H01Q 1/36 |
| CN | 116315618 B | 10/2023 | |

(Continued)

OTHER PUBLICATIONS

CN-112993523-A Translation (Year: 2021).*

(Continued)

*Primary Examiner* — Dameon E Levi
*Assistant Examiner* — Gurbir Singh
(74) *Attorney, Agent, or Firm* — Suiter Swantz IP

(57) ABSTRACT

Piezoelectric materials, particularly ones with high quality factor used for mechanical antenna implementations, are sensitive to environmental conditions including temperature swings, humidity, vibration. Under the varying environmental conditions, the resonant frequency of the piezoelectric antenna can drift, and this results in the dampened piezoelectric radiator performance due to the mismatch between RF source' excitation frequency and piezoelectric antenna's resonant frequency. The frequency drift can be detrimental to the operation of the communication system that involves piezoelectric transmitter/receiver as a system component. In embodiments, the piezoelectric antennas may be integrated into a crystal oscillator to lock a drive frequency of the piezoelectric antennas to a resonant frequency of the piezoelectric antennas.

12 Claims, 16 Drawing Sheets

(56) References Cited

U.S. PATENT DOCUMENTS

| | | | |
|---|---|---|---|
| 7,664,196 | B2 | 2/2010 | Adlerstein |
| 8,031,010 | B1 | 10/2011 | Berquist et al. |
| 8,886,137 | B2 | 11/2014 | Mahmood |
| 8,952,863 | B2 | 2/2015 | Haque et al. |
| 9,177,748 | B2 | 11/2015 | Kemp |
| 9,750,124 | B2 | 8/2017 | Kemp et al. |
| 9,755,765 | B2 | 9/2017 | Dolgin et al. |
| 10,153,555 | B1 | 12/2018 | Cripe et al. |
| 10,498,370 | B2 | 12/2019 | Tong et al. |
| 10,680,326 | B2 | 6/2020 | Georgakopoulos |
| 11,050,447 | B1 | 6/2021 | Ganje et al. |
| 11,088,446 | B2 | 8/2021 | Anderson |
| 11,143,931 | B2 | 10/2021 | Gooth et al. |
| 11,145,971 | B1 | 10/2021 | Cripe |
| 11,307,298 | B2 | 4/2022 | Miller |
| 11,355,692 | B2 | 6/2022 | Sun et al. |
| 11,368,232 | B1 | 6/2022 | Kozyrev |
| 11,450,800 | B2 | 9/2022 | Melandsøet al. |
| 11,594,816 | B2 | 2/2023 | Hassanien et al. |
| 11,784,399 | B2 | 10/2023 | Li et al. |
| 11,791,566 | B2 | 10/2023 | Sepulveda et al. |
| 2002/0014992 | A1 | 2/2002 | Sun et al. |
| 2004/0021098 | A1 | 2/2004 | Gorinevsky et al. |
| 2004/0252069 | A1 | 12/2004 | Rawnick et al. |
| 2007/0176832 | A1 | 8/2007 | Qian et al. |
| 2008/0001829 | A1 | 1/2008 | Rahola et al. |
| 2009/0322646 | A1 | 12/2009 | Dreina et al. |
| 2010/0127953 | A1 | 5/2010 | Wik |
| 2010/0309061 | A1 | 12/2010 | Sinha |
| 2015/0022871 | A1 | 1/2015 | Naono |
| 2016/0003924 | A1 | 1/2016 | Sun et al. |
| 2019/0097119 | A1* | 3/2019 | Kemp .................... H10N 30/40 |
| 2019/0267534 | A1 | 8/2019 | Sun et al. |
| 2020/0235702 | A1* | 7/2020 | Kumar ..................... H03B 5/06 |
| 2020/0350884 | A1 | 11/2020 | Gong et al. |
| 2021/0190894 | A1 | 6/2021 | Box et al. |
| 2021/0288403 | A1 | 9/2021 | Hassanien et al. |
| 2021/0296767 | A1 | 9/2021 | Scherz |
| 2023/0246329 | A1 | 8/2023 | Li et al. |

FOREIGN PATENT DOCUMENTS

| | | | | |
|---|---|---|---|---|
| WO | WO-2006064211 | A1 * | 6/2006 | ............. G01N 29/12 |
| WO | 2012131376 | A1 | 10/2012 | |

OTHER PUBLICATIONS

CN-112993523-A (Year: 2021).*

Mark A. Kemp et al. A high Q piezoelectric resonator as a portable VLF Transmitter. Apr. 12, 2019. Available at: https://www.nature.com/articles/s41467-019-09680-2.

Tianxian Nan et al. Acoustically actuated ultra-compact NEMS magnetoelectric antennas. Aug. 22, 2017. Available at: https://www.nature.com/articles/s41467-017-00343-8.

* cited by examiner

OSCILLATOR INTEGRATED PIEZOELECTRIC RADIATOR

STATEMENT REGARDING FEDERALLY SPONSORED RESEARCH OR DEVELOPMENT

This invention was made with government support under FA8750-20-C-0545 awarded by the Air Force Research Laboratories. The government has certain rights in the invention.

TECHNICAL FIELD

The present invention generally relates to antennas, and more specifically to relates to longitudinal piezoelectric antennas.

BACKGROUND

The VLF band is critically important in high-assurance DoD applications requiring long range and RF-denied environment communications. However, the VLF wavelength measure from approximately ten to a hundred of kilometers in length, resulting in either very large or severely inefficient small antennas when using conventional technology. Therefore, it would be advantageous to provide a device, system, and method that cures the shortcomings described above.

SUMMARY

In some aspects, the techniques described herein relate to a piezoelectric transmitter including: a piezoelectric antenna including: a piezoelectric element; a grounded toroid; an insulating support; wherein the insulating support is coupled to a midpoint of the piezoelectric element; and a field-shaping toroid; and a transmitter circuit; wherein the transmitter circuit is configured to directly drive the piezoelectric element with a voltage; wherein the piezoelectric element is configured to capacitively couple to the grounded toroid and the field-shaping toroid; wherein the voltage from the transmitter circuit causes the piezoelectric element to vibrate with a longitudinal mode; wherein the piezoelectric element couples vibration into an electromagnetic field with a radio frequency; wherein the transmitter circuit, the grounded toroid, and the piezoelectric element form a crystal oscillator; wherein the crystal oscillator includes a drive frequency which is locked to a resonant frequency of the piezoelectric element.

In some aspects, the techniques described herein relate to a piezoelectric transmitter, wherein the grounded toroid is ground to the transmitter circuit; wherein the field-shaping toroid is a floating ground which is not ground to the transmitter circuit.

In some aspects, the techniques described herein relate to a piezoelectric transmitter, wherein the grounded toroid and the field-shaping toroid are separated from a bottom face and a top face of the piezoelectric element, respectively; wherein the bottom face is directly driven with the voltage; wherein the bottom face is configured to capacitively couple to the grounded toroid; wherein the top face is configured to capacitively couple to the field-shaping toroid.

In some aspects, the techniques described herein relate to a piezoelectric transmitter, wherein the bottom face and the top face are metallized.

In some aspects, the techniques described herein relate to a piezoelectric transmitter, wherein the radio frequency is in a VLF band.

In some aspects, the techniques described herein relate to a piezoelectric transmitter, the piezoelectric antenna including a housing; wherein the housing supports the grounded toroid, the piezoelectric element, the insulating support, and the field-shaping toroid.

In some aspects, the techniques described herein relate to a piezoelectric transmitter, including a radome; wherein the radome surrounds the piezoelectric antenna; wherein the radome and the housing are transmissive to the radio frequency.

In some aspects, the techniques described herein relate to a piezoelectric transmitter, wherein the midpoint is an antinode in the vibration of the piezoelectric element.

In some aspects, the techniques described herein relate to a piezoelectric transmitter, wherein the transmitter circuit is configured to measure the drive frequency and determine the radio frequency based on the drive frequency.

In some aspects, the techniques described herein relate to a piezoelectric transmitter, including a modulation plate; wherein the piezoelectric element and the grounded toroid capacitively couple to the modulation plate; wherein the transmitter circuit is configured to adjust a capacitance between the piezoelectric element and the modulation plate based on the drive frequency measured by the transmitter circuit to tune the resonant frequency, the drive frequency, and the radio frequency.

In some aspects, the techniques described herein relate to a piezoelectric transmitter, wherein the piezoelectric antenna is one of a plurality of piezoelectric antennas in an array; wherein the piezoelectric transmitter includes the plurality of piezoelectric antennas.

In some aspects, the techniques described herein relate to a piezoelectric transmitter, wherein the crystal oscillator is one of a plurality of crystal oscillators; wherein the piezoelectric transmitter includes the plurality of crystal oscillators.

In some aspects, the techniques described herein relate to a piezoelectric transmitter, wherein the crystal oscillator includes a Pierce oscillator.

In some aspects, the techniques described herein relate to a piezoelectric transmitter, wherein the Pierce oscillator includes a digital inverter, a resistor, a first capacitor, a second capacitor, the grounded toroid, and the piezoelectric element.

In some aspects, the techniques described herein relate to a piezoelectric transmitter, wherein the digital inverter, the resistor, and the piezoelectric element in series with the grounded toroid are be coupled in parallel between the first capacitor and the second capacitor.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Figure 1A:
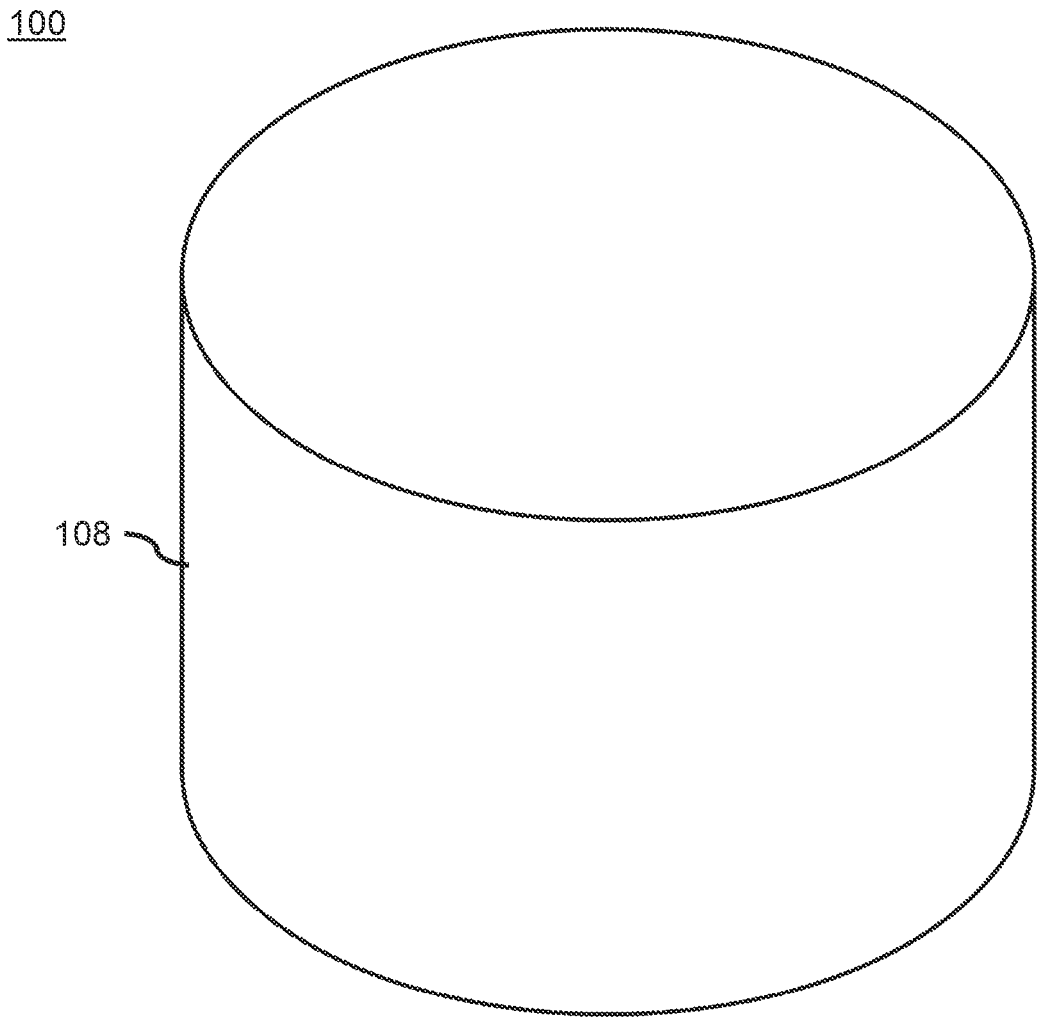
FIG. 1A depicts a perspective view of a piezoelectric transmitter, in accordance with one or more embodiments of the present disclosure.
Figure 1B:
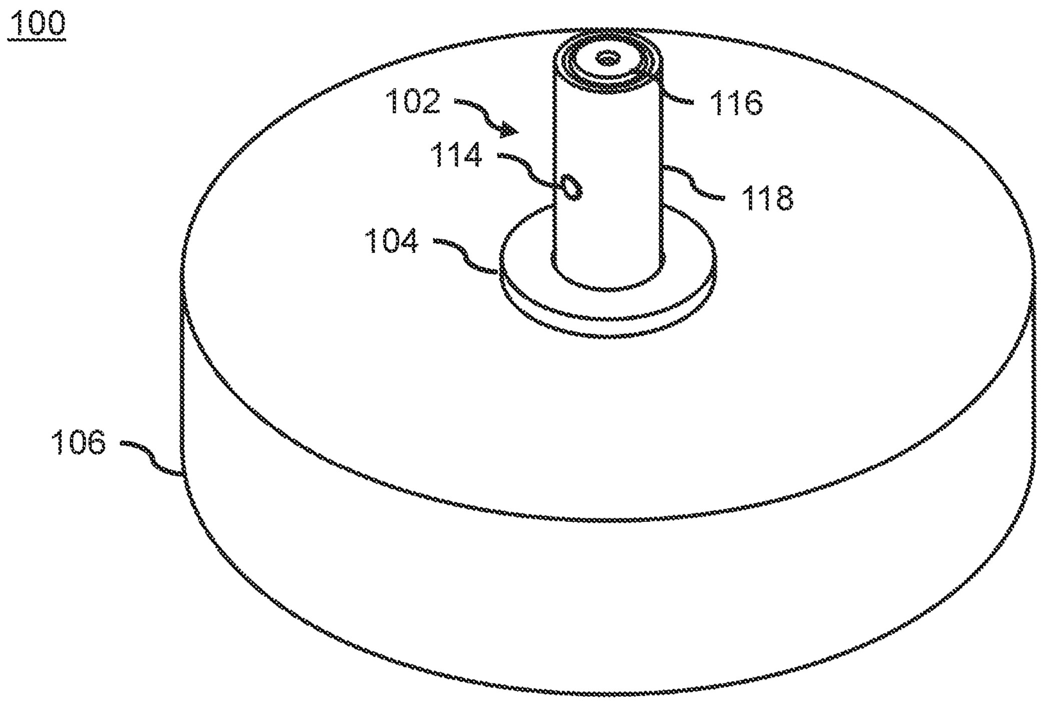
FIG. 1B depicts a perspective view of a piezoelectric transmitter with a radome which is hidden, in accordance with one or more embodiments of the present disclosure.
Figure 1C:
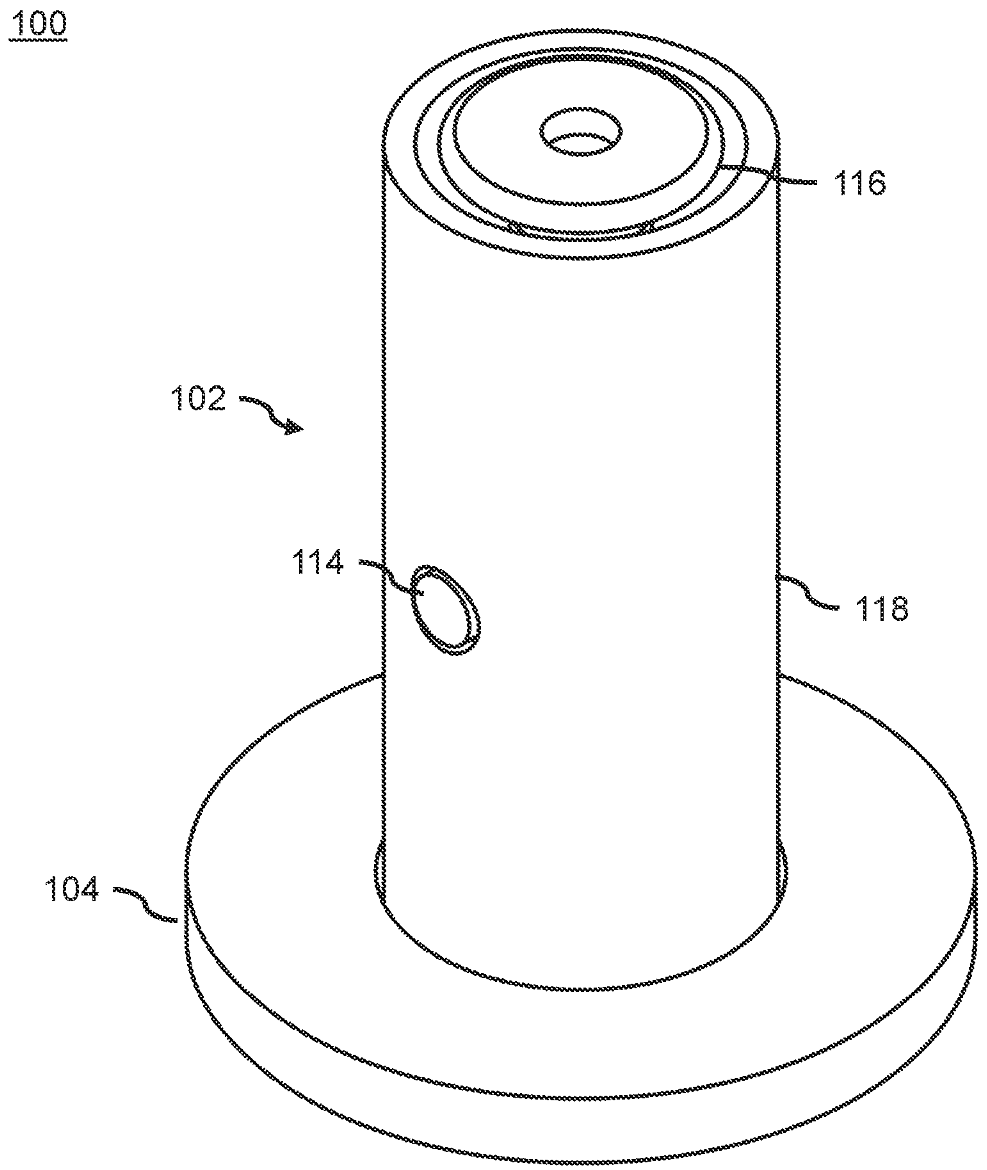
FIG. 1C depicts a perspective view of a piezoelectric transmitter with a radome and a transmitter circuit which are hidden, in accordance with one or more embodiments of the present disclosure.
Figure 1D:
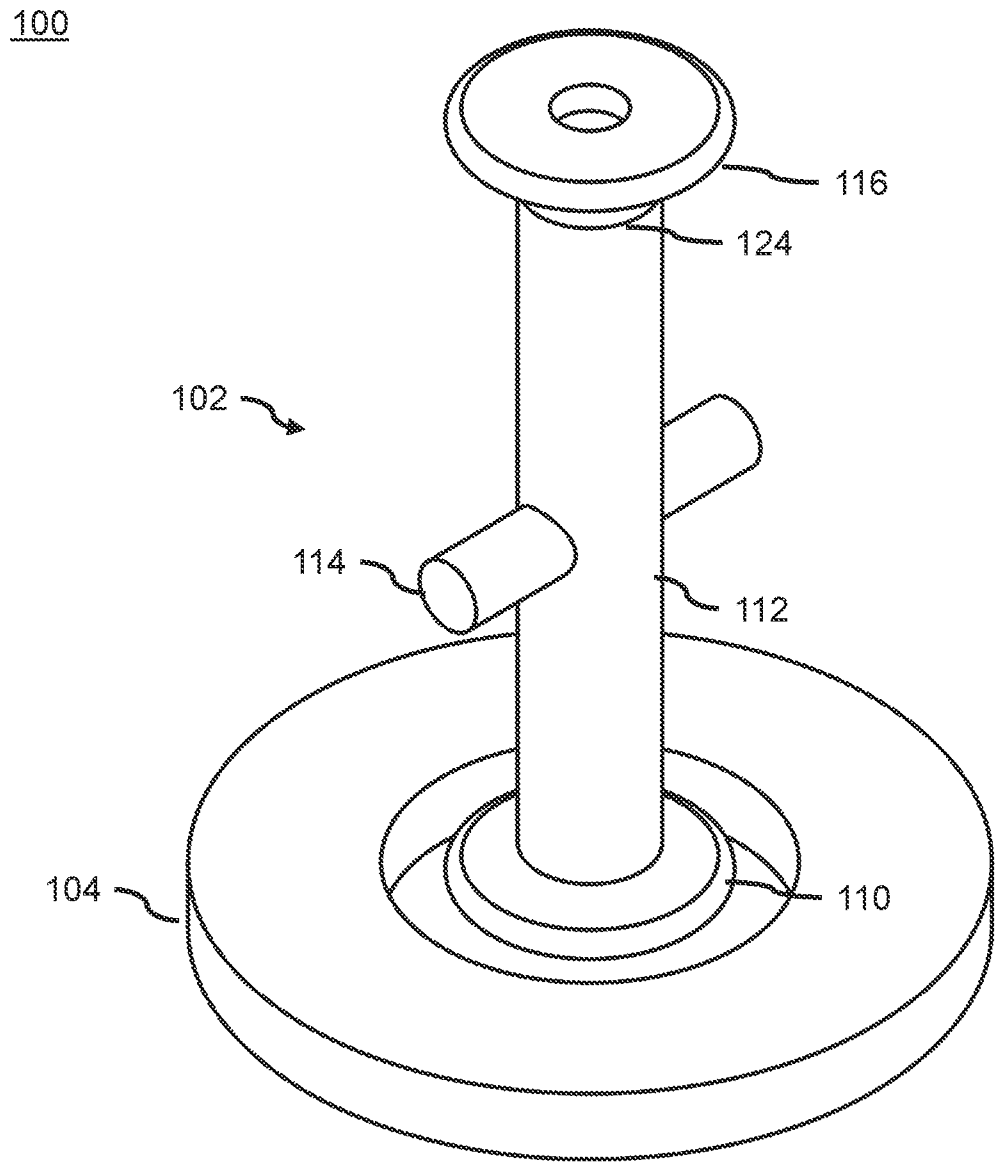
FIG. 1D depicts a perspective view of a piezoelectric transmitter with a radome, transmitter circuit, and housing which are hidden, in accordance with one or more embodiments of the present disclosure.
Figure 1E:
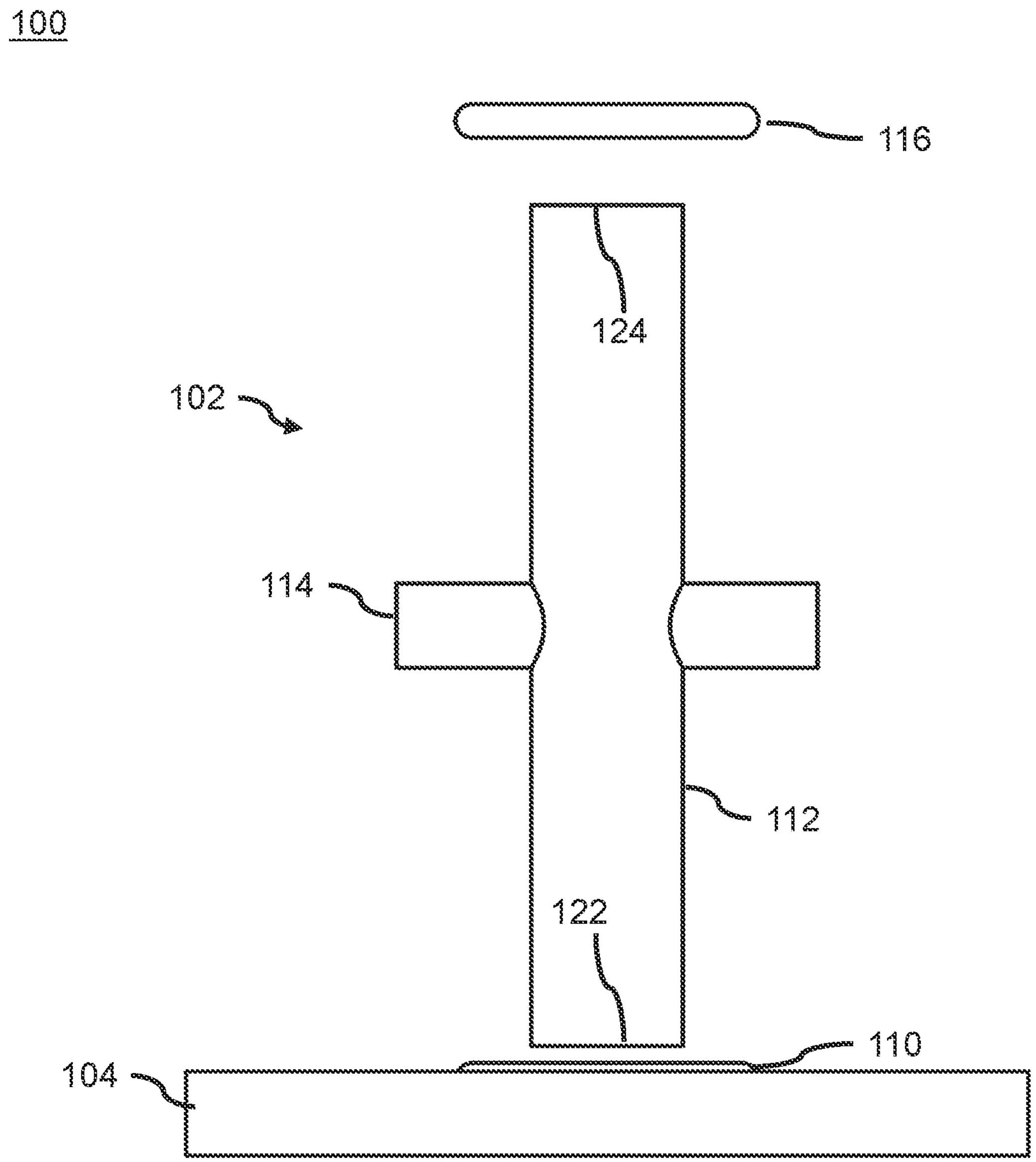
FIG. 1E depicts a front view of a piezoelectric transmitter with a radome, transmitter circuit, and housing which are hidden, in accordance with one or more embodiments of the present disclosure.
Figure 1F:
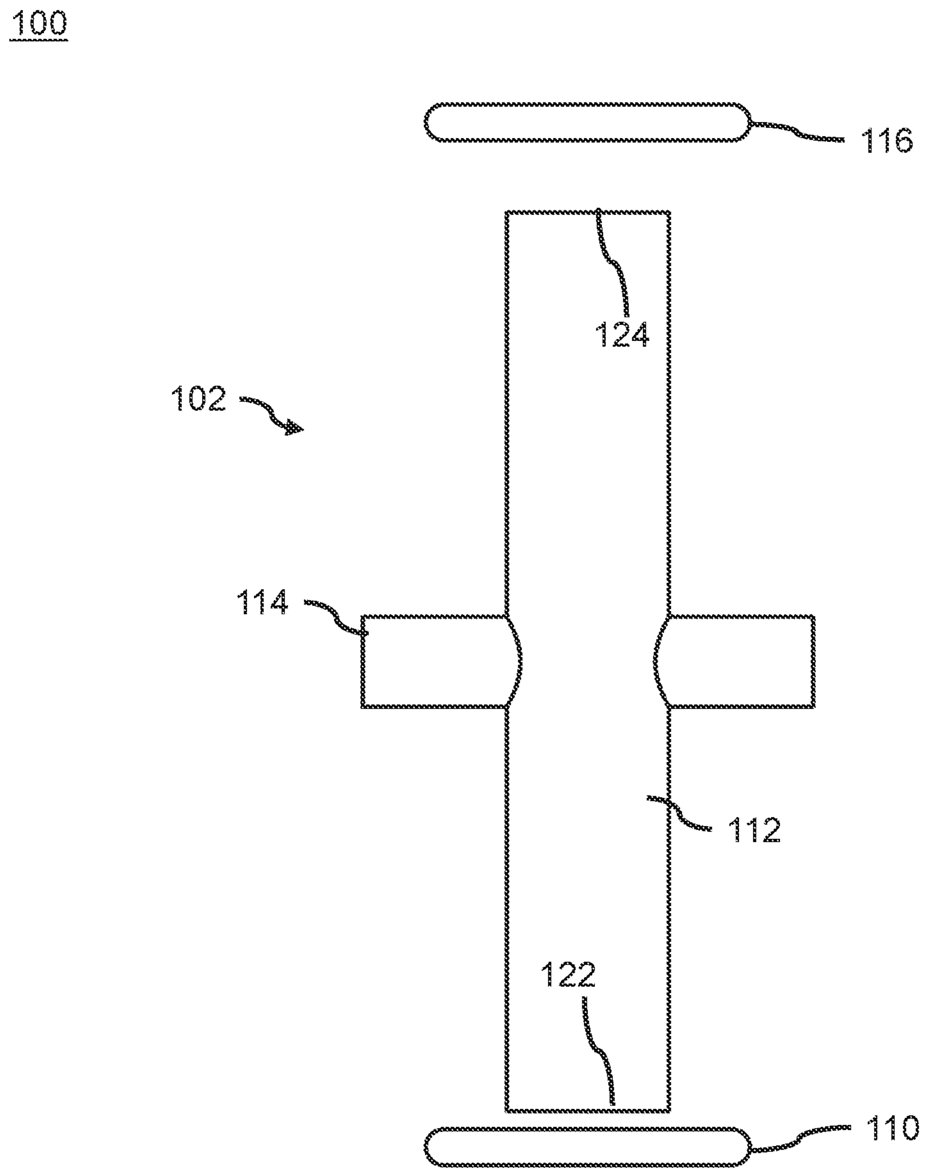
FIG. 1F depicts a perspective view of a piezoelectric transmitter with a radome, transmitter circuit, housing, and modulation plate which are hidden, in accordance with one or more embodiments of the present disclosure.
Figure 1G:
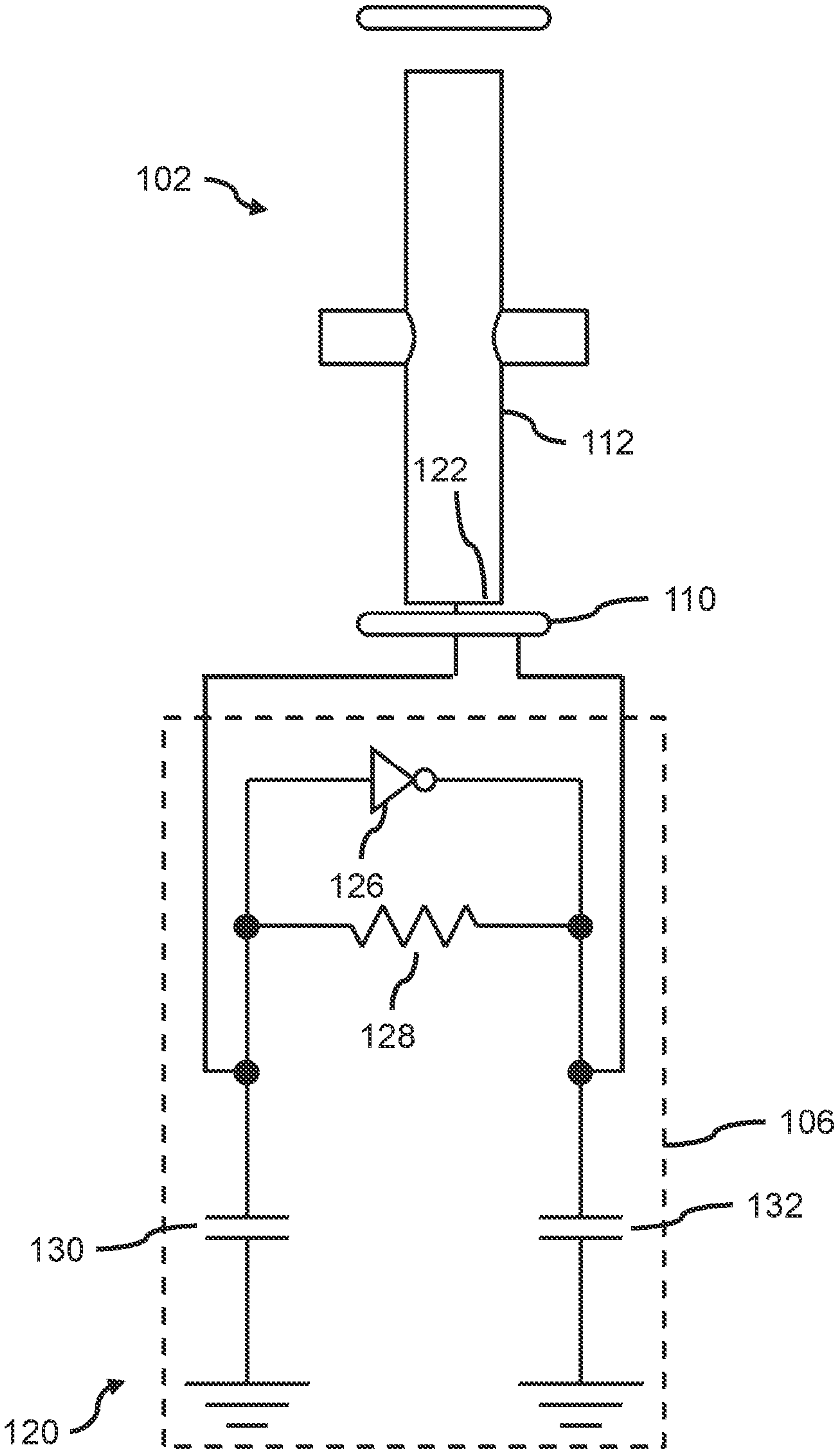
FIG. 1G depicts a crystal oscillator formed from a piezoelectric antenna and a transmitter circuit of a piezoelectric transmitter, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Referring generally now to one or more embodiments of the present disclosure. Embodiments of the present disclosure are directed to piezoelectric antennas. Piezoelectric antennas are potential enablers for portable low frequency systems at VLF band, which is critically important in high-assurance applications requiring long range and RF-denied environment communications. Low frequency systems can benefit from compact low frequency antennas. The piezoelectric antennas may radiate VLF waves efficiently in a small form factor, useful for mobile, low power, transportable, low-frequency communication systems. The piezoelectric antennas are a mechanical technology that transmits by vibrating charges in a piezoelectric crystal.

Piezoelectric materials, particularly ones with high quality factor used for mechanical antenna implementations, are sensitive to environmental conditions including temperature swings, humidity, vibration. Under the varying environmental conditions, the resonant frequency of the piezoelectric antenna can drift, and this results in the dampened piezoelectric radiator performance due to the mismatch between RF source' excitation frequency and piezoelectric antenna's resonant frequency. The frequency drift can be detrimental to the operation of the communication system that involves piezoelectric transmitter/receiver as a system component. In embodiments, the piezoelectric antennas may be integrated into a crystal oscillator to lock a drive frequency of the piezoelectric antennas to a resonant frequency of the piezoelectric antennas.

U.S. Patent Publication Number US20190097119A1, titled "Piezoelectric Transmitter"; U.S. Pat. No. 10,153,555B1, titled "Systems and methods for switched reluctance magnetic mechtenna"; U.S. Pat. No. 11,784,399B2, titled "Dual-band very low frequency antenna"; U.S. Patent Publication Number US20210288403A1, titled "Acoustically-driven electromagnetic antennas using piezoelectric material"; U.S. Patent Publication Number US20190267534A1, titled "Magnetoelectric Very Low Frequency Communication System"; U.S. Patent Publication Number US20100309061A1, titled "A micro antenna device"; PCT Patent Publication Number WO2012131376A1, titled "Apparatus and methods"; are each incorporated herein by reference in the entirety.

Referring to FIGS. 1A-1G, a piezoelectric transmitter 100 is described, according to one or more embodiments of the present disclosure. The piezoelectric transmitter 100 may include one or more components, such as, but not limited to, piezoelectric antennas 102, modulation plate 104, transmitter circuit 106, radome 108, crystal oscillator 120, and the like.

The piezoelectric transmitter 100 may include the piezoelectric antennas 102. The piezoelectric antennas 102 may include a grounded toroid 110, piezoelectric elements 112, insulating supports 114, field-shaping toroids 116, housing 118, and the like.

The piezoelectric antennas 102 may include the piezoelectric elements 112. The piezoelectric elements 112 may be formed from a piezoelectric material. For example, the piezoelectric material may include quartz, aluminum nitride (AlN), lithium niobate (LiNbO3), lithium tantalate (LiTaO3), zinc oxide, gallium nitride, lead zirconate titanate (PZT), Lead Magnesium Niobate/Lead Titanate (PMN-PT), and the like. The piezoelectric material may be a high-permittivity piezoelectric material. The high-permittivity piezoelectric material can be, for example, lead zirconate titanate (PZT) or Lead Magnesium Niobate/Lead Titanate (PMN-PT). The piezoelectric elements 112 may include a Quality factor (Q-factor). In embodiments, the piezoelectric elements 112 may include a high Q-factor. For example, the piezoelectric elements 112 may be an LN rod with a high Q-factor (>30 k). The piezoelectric elements 112 may be considered a narrowband device by the high Q-factor.

The piezoelectric elements 112 may include a shape. For example, the shape may include, but is not limited to, a cylinder, a cuboid, or the like. The piezoelectric elements 112 may include opposing faces. The opposing faces may refer to a bottom face 122 and top face 124 of the piezoelectric elements 112. In this regard, the opposing faces may include the bottom face 122 and the top face 124, where the top face 124 is opposed to the bottom face 122. For example, the bottom face 122 and/or the top face 124 of the piezoelectric elements 112 may include a round shape where the piezoelectric elements 112 is a cylinder or a square shape where the piezoelectric elements 112 is a cuboid. The piezoelectric elements 112 may include a length. The length may span between the bottom face 122 and the top face 124. The length of the piezoelectric elements 112 may be on the order of centimeters. For example, the length of the piezoelectric elements 112 may be 10 cm.

The piezoelectric antennas 102 may include the grounded toroid 110 and/or the field-shaping toroids 116. The grounded toroid 110 and/or the field-shaping toroids 116 may include a surface of revolution with a hole in a middle. The surface of revolution may include, but is not limited to, a circle (e.g., a torus/circular toroid), a square (i.e., square toroid), or the like. The grounded toroid 110 may be ground to the transmitter circuit 106. The grounded toroid 110 may be grounded to the transmitter circuit 106 via one or more wires (not depicted). The field-shaping toroids 116 may include a floating ground. For example, the field-shaping toroids 116 may not be electrically connected to a ground. For instance, the field-shaping toroids 116 may not be ground to the transmitter circuit 106.

The grounded toroid 110 and the field-shaping toroids 116 may be separated from the bottom face 122 and the top face 124 of the piezoelectric elements 112, respectively. For example, the grounded toroid 110 and the field-shaping toroids 116 may be separated from the bottom face 122 and the top face 124 of the piezoelectric elements 112 thereby defining a bottom gap and a top gap, respectively. The bottom gap and/or top gap may include any suitable dielectric, such as, but not limited to, air, vacuum, or the like.

The piezoelectric elements 112 may capacitively couple to the grounded toroid 110 and the field-shaping toroids 116. The bottom face 122 and top face 124 of the piezoelectric elements 112 may capacitively couple to the grounded toroid 110 and the field-shaping toroids 116, respectively. For example, the piezoelectric elements 112 may capacitively couple to the grounded toroid 110 through the bottom gap defined between the bottom face 122 of piezoelectric elements 112 and the grounded toroid 110. By way of another example, the piezoelectric elements 112 may capacitively couple to the field-shaping toroids 116 through the top gap defined between the top face 124 of the piezoelectric elements 112 and the field-shaping toroids 116. The bottom face 122 and/or top face 124 of the piezoelectric elements 112 may be metallized. For example, the bottom face 122 and/or top face 124 may be metallized with titanium, gold, or the like. The bottom face 122 and/or top face 124 of the piezoelectric elements 112 may be metallized to enable capacitively coupling with the modulation plate 104, the grounded toroid 110, and/or the field-shaping toroids 116.

The piezoelectric transmitter 100 may include the transmitter circuit 106. The transmitter circuit 106 may be disposed below the piezoelectric antennas 102 and/or the modulation plate 104. The transmitter circuit 106 may be configured to directly drive the piezoelectric elements 112 with a voltage. For example, the bottom face 122 of the piezoelectric elements 112 may be driven with the voltage from the transmitter circuit 106. In this regard, the piezoelectric elements 112 may be bottom-fed. The hole in the grounded toroid 110 may enable coupling the piezoelectric elements 112 to the transmitter circuit 106 with a wire through the grounded toroid 110.

The piezoelectric elements 112 may be a harmonic oscillator with a resonant frequency. The resonant frequency may be based on stiffness, mass, length, external capacitance, and the like. For example, the resonant frequency may be proportional to the length. For instance, the resonant frequency may be reduced by one-fourth when the length is increased by four.

The voltage from the transmitter circuit 106 may cause the piezoelectric elements 112 to vibrate. The piezoelectric elements 112 may vibrate via one or more acoustic waves. The acoustic waves may propagate through the piezoelectric elements 112. In embodiments, the piezoelectric elements 112 may vibrate with a longitudinal mode. The longitudinal mode may also be referred to as a length-extensional mode. The change in length of the piezoelectric elements 112 during vibration in the longitudinal mode may be on the micrometer or nanometer scale. The piezoelectric elements 112 may be driven by the transmitter circuit 106 at the resonant frequency of the piezoelectric elements 112.

The piezoelectric antennas 102 may include the insulating supports 114. The insulating supports 114 may include, but are not limited to, quartz rods. The insulating supports 114 may be coupled to a midpoint of the piezoelectric elements 112. The midpoint may refer to a point midway along a length of the piezoelectric elements 112. For example, the piezoelectric antennas 102 may include a pair of the insulating supports 114 which are horizontally oriented where the piezoelectric elements 112 is vertically oriented. The bottom face 122 and/or the top face 124 of the piezoelectric elements 112 may be cantilevered at the midpoint of the piezoelectric elements 112. For example, the piezoelectric elements 112 may be supported at the midpoint of the piezoelectric elements 112. In this regard, the bottom face 122 and/or the top face 124 of the piezoelectric elements 112 may be mechanically supported only at the midpoint.

The piezoelectric elements 112 may include one or more null points in the vibration. The midpoint of the piezoelectric elements 112 may be a null point in the vibration. The bottom face 122 and/or top face 124 of the piezoelectric elements 112 may extend and contract relative to the midpoint. In this regard, the piezoelectric elements 112 may include an n=2 vibration mode when vibrated at the resonant frequency, where the midpoint of the piezoelectric elements 112 includes near zero-displacement. It is further contemplated that the piezoelectric elements 112 may include an even vibration mode (e.g., n=2*m, where m is an integer). Cantilevering the opposing faces of the piezoelectric elements 112 at the midpoint of the piezoelectric elements 112 may enable the piezoelectric elements 112 to vibrate with the longitudinal mode. In this regard, the midpoint may be considered an anti-node in the vibration of the piezoelectric elements 112. The anti-node may refer to a location in the vibration which an amplitude of the vibration is at minimum. The insulating supports 114 may include a radius which is sufficiently small to allow the piezoelectric elements 112 to vibrate while constraining the piezoelectric elements 112 to the n=2 vibration mode. The length of the piezoelectric elements 112 may define an acoustic wavelength of the piezoelectric elements 112. For example, the length may be twice the acoustic wavelength where the piezoelectric elements 112 includes the n=2 vibration mode.

The piezoelectric elements 112 may couple the vibration into an electromagnetic field with a radio frequency. The piezoelectric elements 112 may generate an electromagnetic field around the piezoelectric elements 112 when driven at the resonant frequency of the piezoelectric elements 112. The piezoelectric elements 112 may generate a large dipole moment and subsequently radiate the radio frequency. The piezoelectric elements 112 may resonate at the resonant frequency to radiate energy as the electric dipole. The negative end and positive end of the dipole may be the bottom face 122 and top face 124 of the piezoelectric elements 112, respectively.

The frequency of radiation may be proportional to the size of the piezoelectric elements 112. The length of the piezoelectric elements 112 may be shorter than the electromagnetic wavelength at the operation frequency. In this regard, the piezoelectric elements 112 are physically and electrically short antennas. The radio frequency may be in the very low frequency ("VLF") or low frequency ("LF") band. For example, the VLF band may include a frequency 3 and 30 kHz and a wavelength between 100 and 10 km (e.g., 99.91 and 9.99 km). By way of another example, the LF band may include a frequency between 30 and 300 kHz and a wavelength between 10 and 1 km. Piezoelectric (mechanical) resonant length may be based on acoustic wavelength (~cm). The acoustic wavelength, and similarly the length of the piezoelectric elements 112, may be between 4 and 5 orders of magnitude shorter than electromagnetic wavelength (~km) at kHz frequencies. Therefore, much smaller resonant lengths are possible with the piezoelectric elements 112. For example, the piezoelectric elements 112 may be 10 centimeter long and resonating at a frequency of around 35 kHz (e.g., a wavelength around 8.541 km).

The field-shaping toroids 116 may prevent any peak electric fields from forming. For example, the field-shaping toroids 116 may distribute the potential electric field so that the electric field does not break down the dielectric (e.g., air) causing arcing between the piezoelectric elements 112 and the field-shaping toroids 116. The field-shaping toroids 116 may distribute the electric field around the field-shaping toroids 116.

The piezoelectric antennas 102 may include the housing 118. The housing 118 may support the grounded toroid 110, piezoelectric elements 112, insulating supports 114, field-shaping toroids 116, and the like. The housing 118 may include a shape, such as, but not limited to, a hollow cylindrical shape. The grounded toroid 110, piezoelectric elements 112, insulating supports 114, and field-shaping toroids 116 may be disposed within the housing 118. The housing 118 may include one or more through holes through which the insulating supports 114 are inserted to support the insulating supports 114 and the piezoelectric elements 112. The housing 118 may suspend the grounded toroid 110 below the piezoelectric elements 112. The housing 118 may suspend the field-shaping toroids 116 above the piezoelectric elements 112.

The piezoelectric transmitter 100 may include the modulation plate 104. The piezoelectric elements 112 and/or the grounded toroid 110 may capacitively couple to the modulation plate 104. The transmitter circuit 106 may include a switch and/or capacitor coupled to the modulation plate 104. The modulation plate 104 may be driven by the transmitter circuit 106 causing one or more changes in the resonant frequency of the piezoelectric elements 112.

The piezoelectric transmitter 100 may include the radome 108. The radome 108 may surround the piezoelectric antennas 102, modulation plate 104, and/or transmitter circuit 106. The radome 108 may include a shape, such as, but not limited to a cylindrical bowl shape (as depicted), a hemicylindrical bowl shape, a hemispherical bowl shape, or the like. The shape of the radome 108 may be selected based on a platform to which the piezoelectric transmitter 100 is coupled. For example, the radome 108 may be shaped to reduce an aerodynamic drag of the piezoelectric transmitter 100.

The radome 108 and/or the housing 118 may be transmissive to the radio frequency of the electromagnetic radiation generated by the piezoelectric elements 112. In embodiments, the radome 108 and/or the housing 118 may be transmissive to the VLF band. For example, the radome 108 and/or the housing 118 may be transmissive to the bands used by the piezoelectric antennas 102. The radome 108 and/or the housing 118 may be made of any material that is transparent to the bands. For example, the radome 108 and/or the housing 118 may be made of a composite material, or the like.

The resonant frequency of the piezoelectric elements 112 may change. For example, the resonant frequency may experience frequency drifts due to environmental effects on the piezoelectric elements 112. Temperature and instrument drifts may cause the piezoelectric elements 112 to operate at suboptimum frequency.

The piezoelectric elements 112 may be driven at a source oscillator frequency which may or may not match the resonant frequency of the piezoelectric elements 112. The piezoelectric elements 112 may include a maximum efficiency when the drive frequency is matched to the resonant frequency. The piezoelectric elements 112 may be considered detuned when driven at a drive frequency which does not match the resonant frequency. Frequency shifts in the resonant frequency of the piezoelectric elements 112 which are not matched by the source oscillator frequency may lead to reduced power in the electromagnetic field generated by the piezoelectric elements 112. For example, if the source oscillator frequency drives the piezoelectric elements 112 at a value other than the resonant frequency then the anti-nodes may be at a point other than the midpoint such that the insulating supports 114 may damp the vibrations.

In embodiments, the transmitter circuit 106, the grounded toroid 110, and the piezoelectric element 112, may form a crystal oscillator 120. The crystal oscillator 120 may be an oscillator integrated crystal antenna radiator. The piezoelectric element 112 may be integrated in the feedback path of the crystal oscillator 120. The crystal oscillator 120 may include a drive frequency which is locked to the resonant frequency of the piezoelectric element 112. The drive frequency may be locked to the resonant frequency by integrating the piezoelectric element 112 in the feedback path of the crystal oscillator 120.

The transmitter circuit 106 may cause the piezoelectric element 112 to vibrate by applying a voltage with the drive frequency to the piezoelectric element 112. Applying the voltage with the drive frequency to the piezoelectric element 112 may cause the piezoelectric element 112 to oscillate at the resonant frequency. The drive frequency of the crystal oscillator 120 is locked to the resonant frequency when the resonant frequency experiences drifts. The crystal oscillator 120 tracks changes in the resonant frequency. Locking the drive frequency to the resonant frequency may stabilize the piezoelectric element 112 to ensure maximum performance. The piezoelectric transmitter 100 may be robust to environmental conditions. Changes in the resonant frequency may be followed by the crystal oscillator 120 to maintain driving the piezoelectric element 112 at the resonant frequency and maintain the electromagnetic field at a peak output.

The crystal oscillator 120 may include any suitable crystal oscillator topology which includes the piezoelectric element 112 as a piezoelectric crystal resonator. For example, the crystal oscillator 120 may include, but is not limited to, a Pierce oscillator, a Colpitts oscillator, a Butler oscillator, or the like.

In embodiments, the crystal oscillator 120 may be a Pierce oscillator. The piezoelectric element 112 may be integrated in the feedback path of the Pierce oscillator. The Pierce oscillator may include one or more components, such as, but not limited to, a digital inverter 126, a resistor 128, a first capacitor 130, a second capacitor 132, the grounded toroid 110, and the piezoelectric element 112. The piezoelectric element 112 may be considered a crystal of the Pierce oscillator. The piezoelectric element 112 may be capacitively coupled to the grounded toroid 110 such that the piezoelectric element 112 is in series with the grounded toroid 110. The digital inverter 126, the resistor 128, and the piezoelectric element 112 in series with the grounded toroid 110 may be coupled in parallel between the first capacitor 130 and the second capacitor 132.

In embodiments, the transmitter circuit 106 may measure the drive frequency. For example, the transmitter circuit 106 may include a frequency sensor to measure the drive frequency. The transmitter circuit 106 may measure the drive frequency when locked to the resonant frequency to determine the radio frequency of the electromagnetic field generated by the piezoelectric elements 112. The transmitter circuit 106 may thus determine the radio frequency based on the drive frequency (e.g., based on the resonant frequency).

In embodiments, the resonant frequency of the piezoelectric elements 112 and/or the radio frequency of the electromagnetic field generated by the piezoelectric elements 112 may be based on the capacitance between the piezoelectric elements 112 and the modulation plate 104. The capacitance between the piezoelectric elements 112 and the modulation plate 104 may be adjustable by the transmitter circuit 106. In embodiments, the resonant frequency may change when capacitance is applied to the modulation plate 104. The change in the resonant frequency may cause corresponding changes in the drive frequency and the radio frequency of the electromagnetic field generated by the piezoelectric element 112. The drive frequency may follow the resonant frequency when the resonant frequency is changed by the modulation plate 104. The transmitter circuit 106 may adjust the capacitance between the piezoelectric elements 112 and the modulation plate 104 based on the drive frequency to tune the resonant frequency, the drive frequency, and the radio frequency. The crystal oscillator 120 may remove a need to manually tune the piezoelectric elements 112 to the resonant frequency when changing the capacitance to adjust the radio frequency.

Figure 2A:
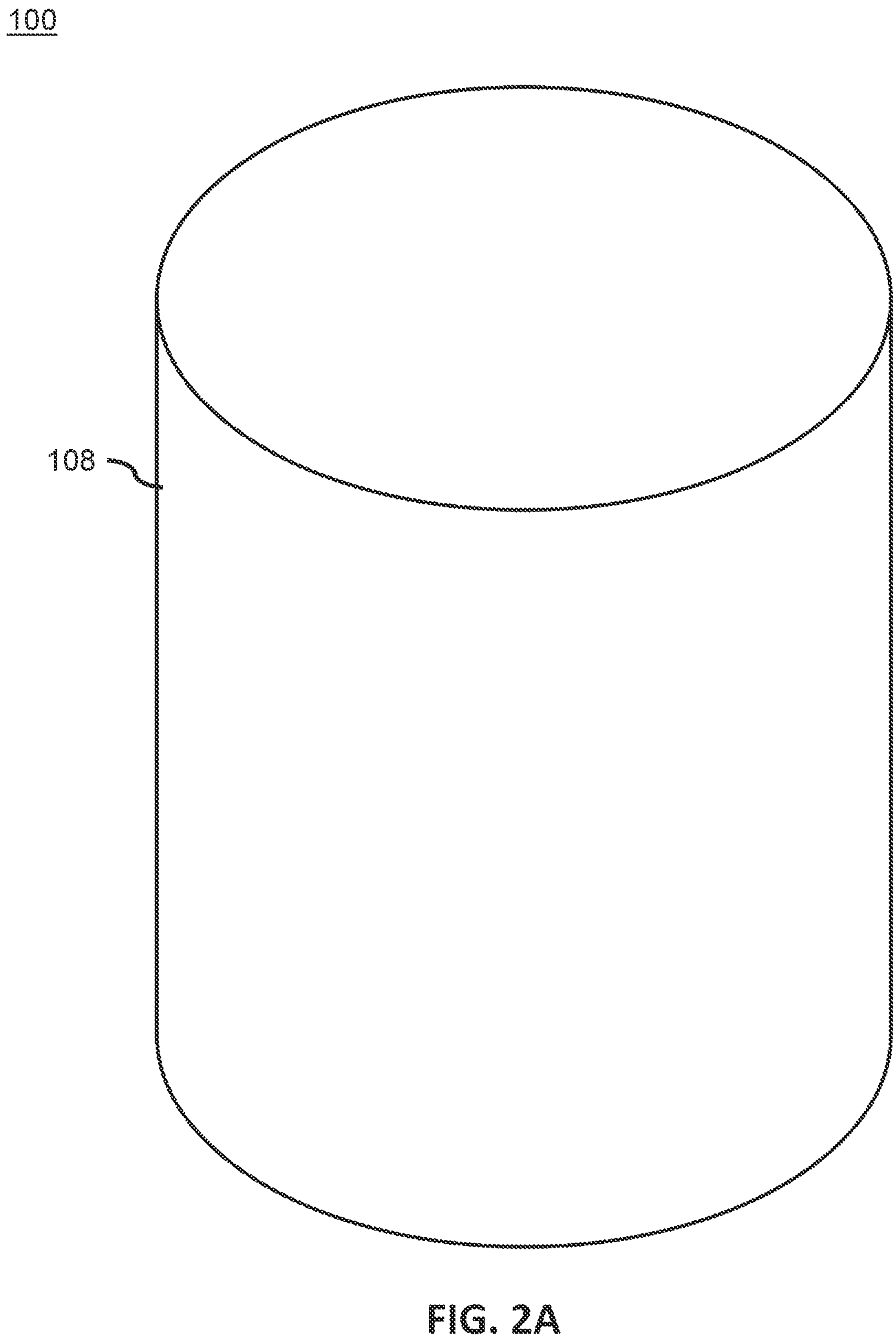
FIG. 2A depicts a perspective view of a piezoelectric transmitter, in accordance with one or more embodiments of the present disclosure.
Figure 2B:
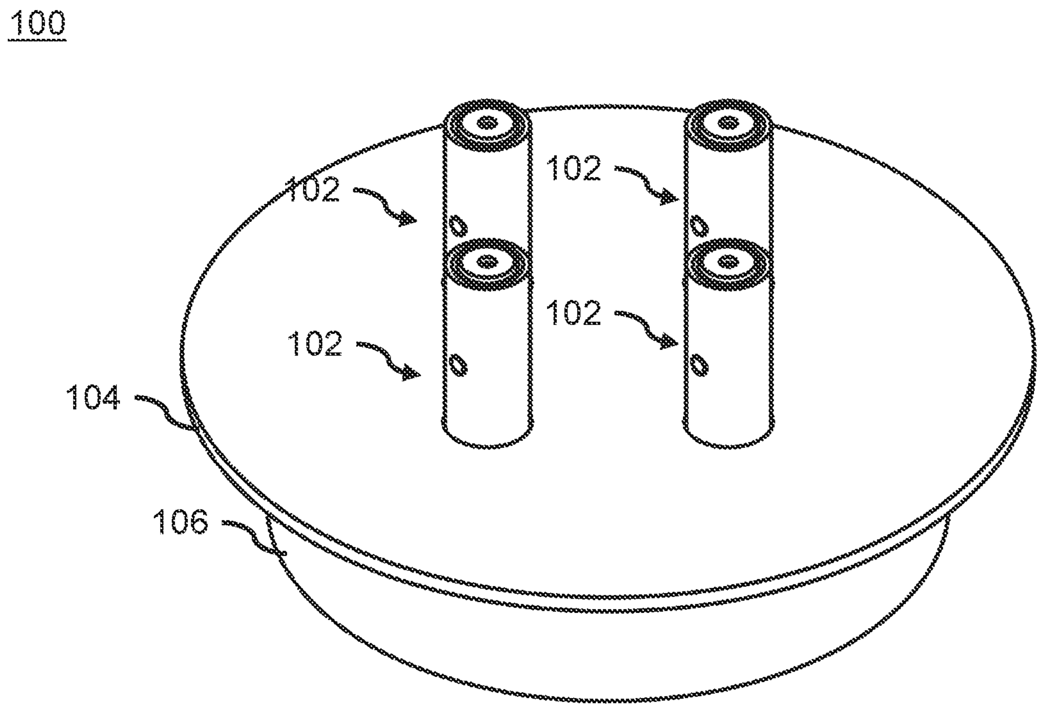
FIG. 2B depicts a perspective view of a piezoelectric transmitter with a radome which is hidden, in accordance with one or more embodiments of the present disclosure.
Figure 2C:
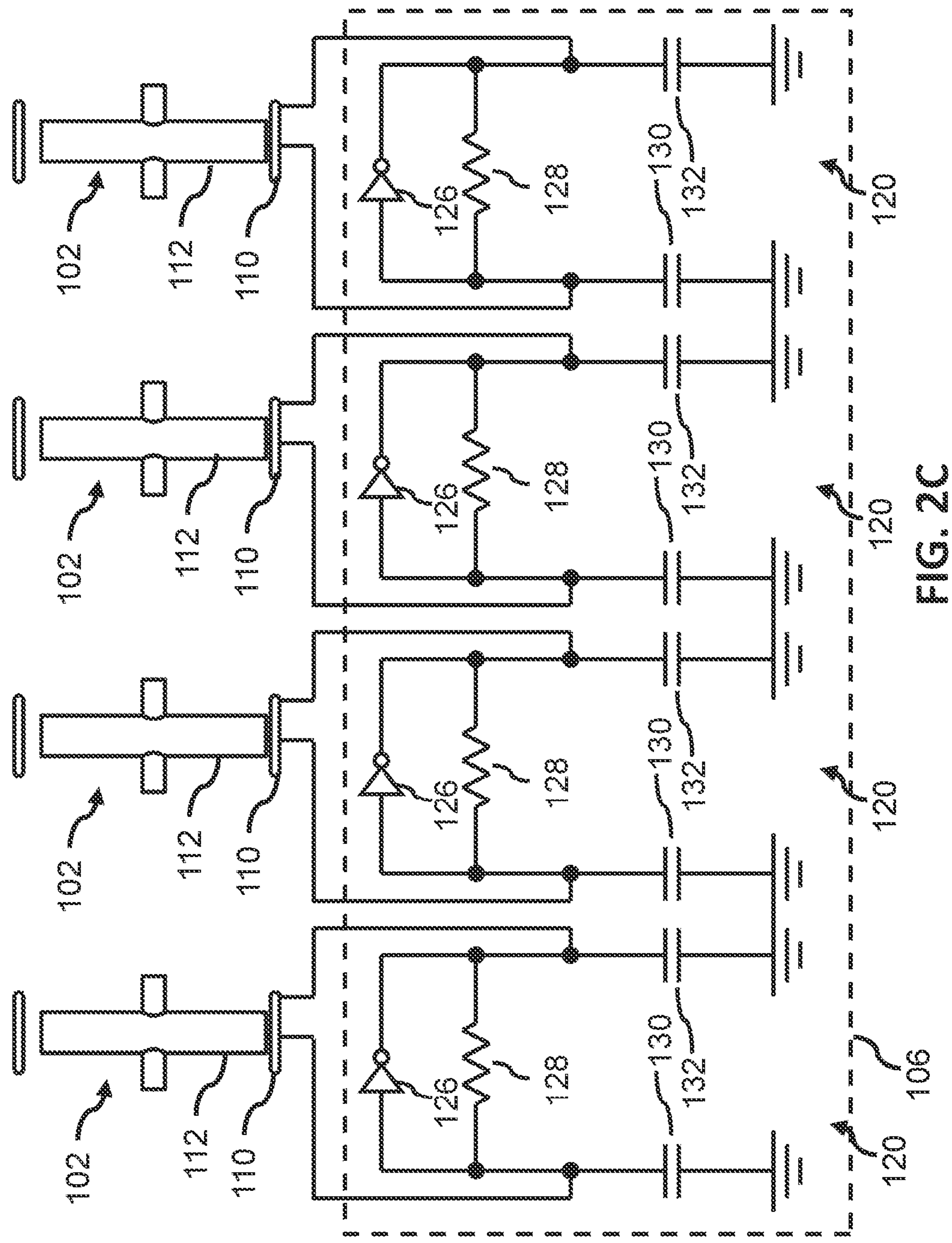
FIG. 2C depicts crystal oscillators formed from piezoelectric antennas and a transmitter circuit of a piezoelectric transmitter, in accordance with one or more embodiments of the present disclosure.
Figure 3A:
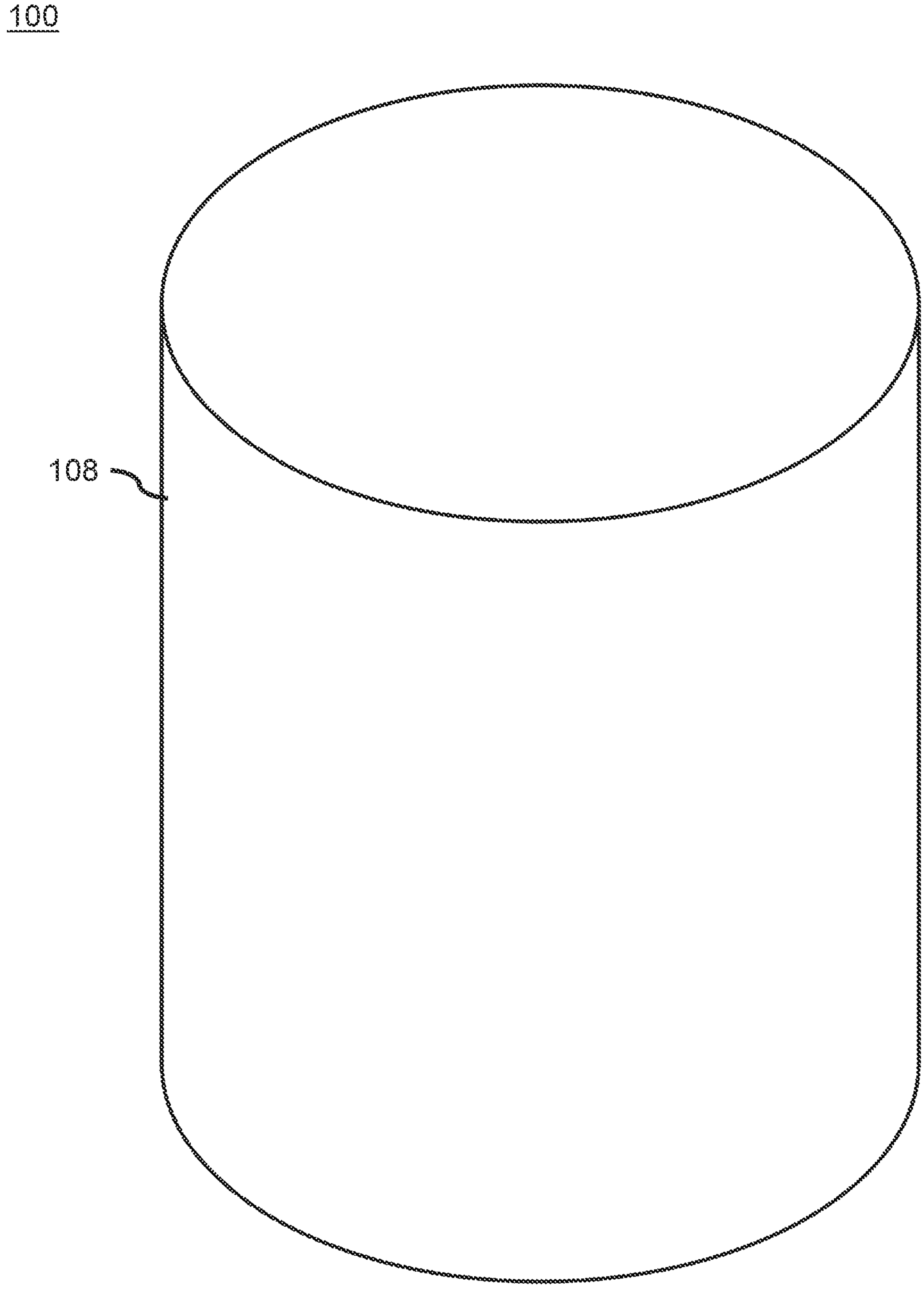
FIG. 3A depicts a perspective view of a piezoelectric transmitter, in accordance with one or more embodiments of the present disclosure.
Figure 3B:
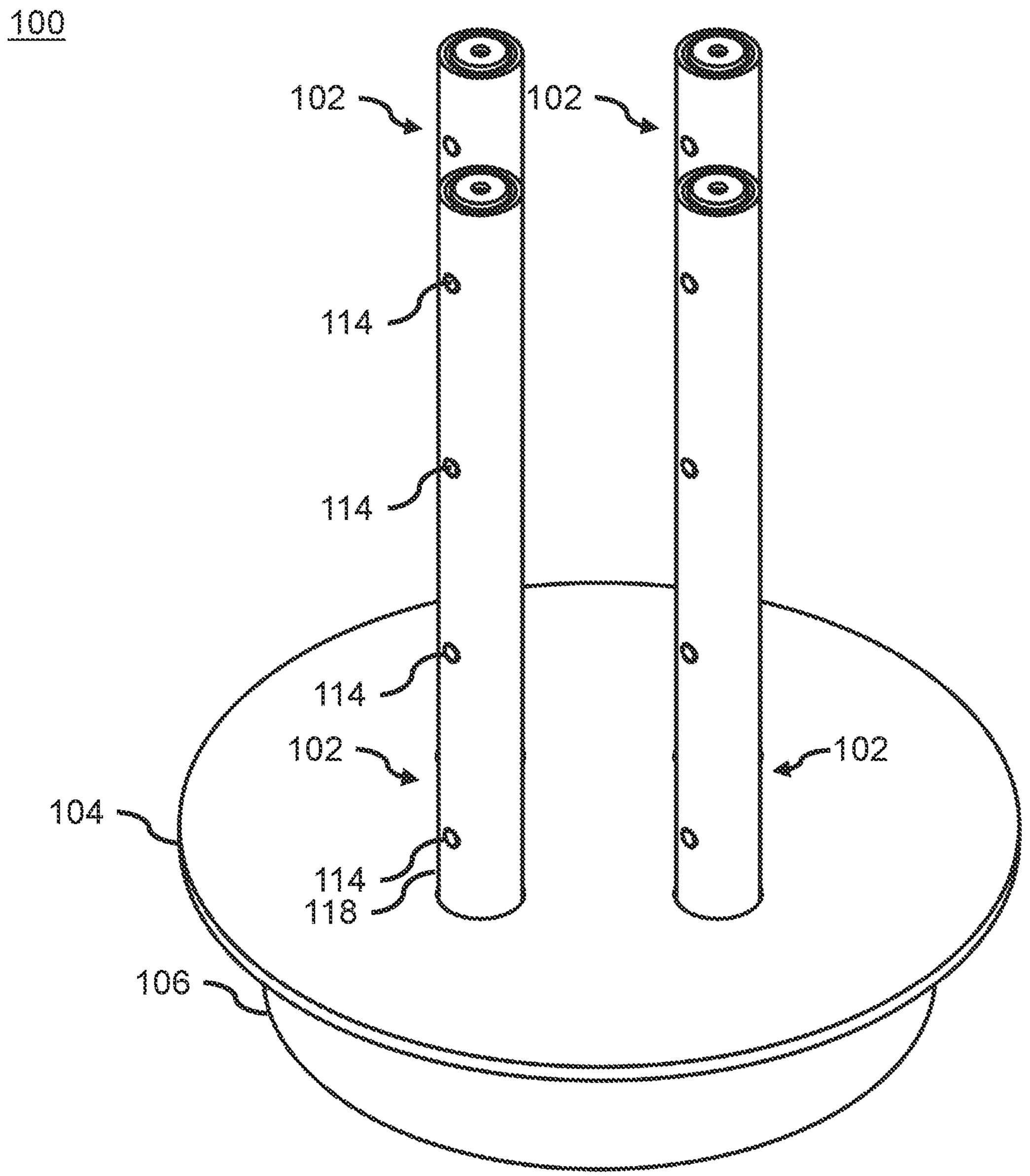
FIG. 3B depicts a perspective view of a piezoelectric transmitter with a radome which is hidden, in accordance with one or more embodiments of the present disclosure.
Figure 3C:
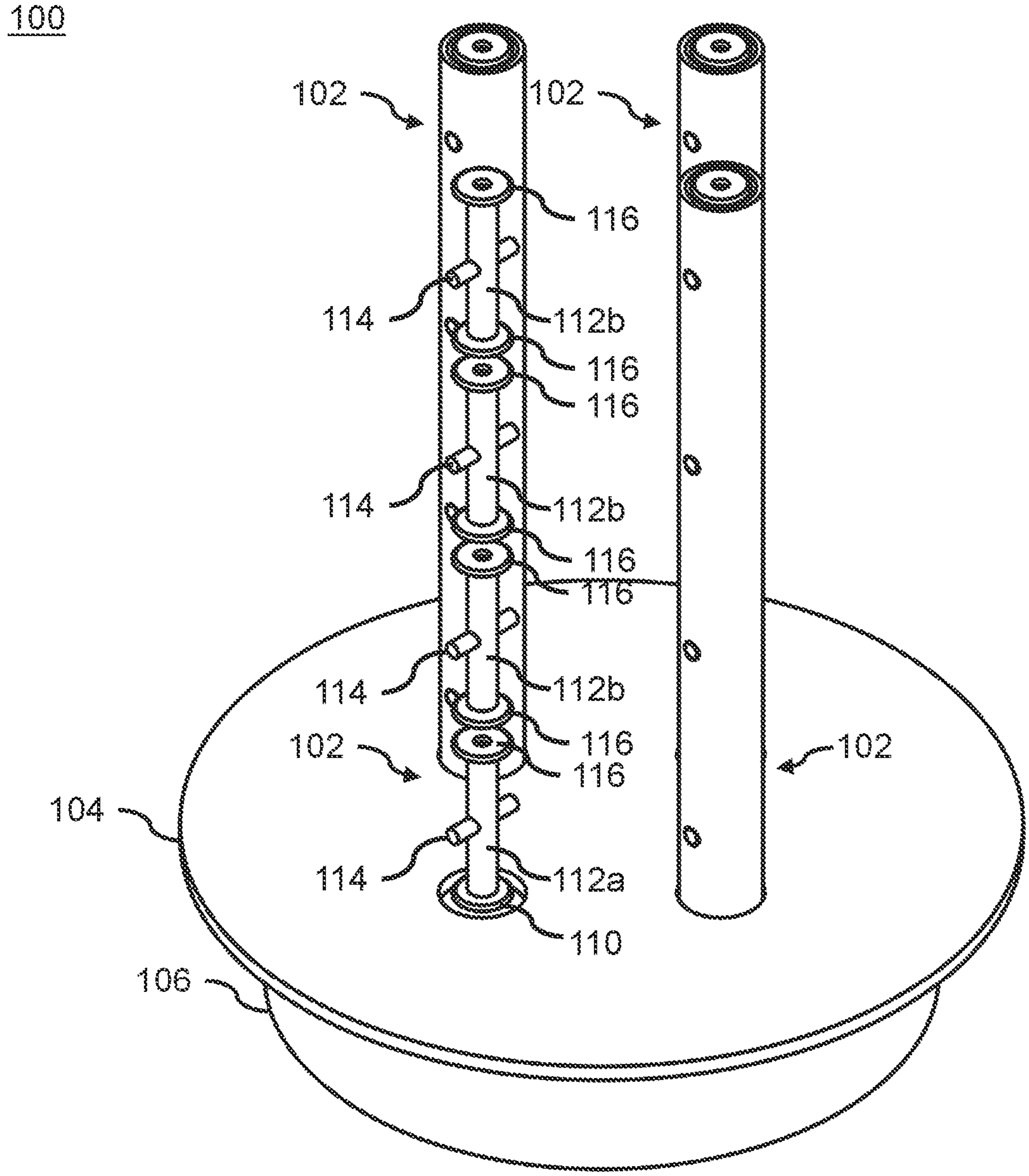
FIG. 3C depicts a perspective view of a piezoelectric transmitter with a radome and a piezoelectric antenna housing which is hidden, in accordance with one or more embodiments of the present disclosure.
Figure 3D:
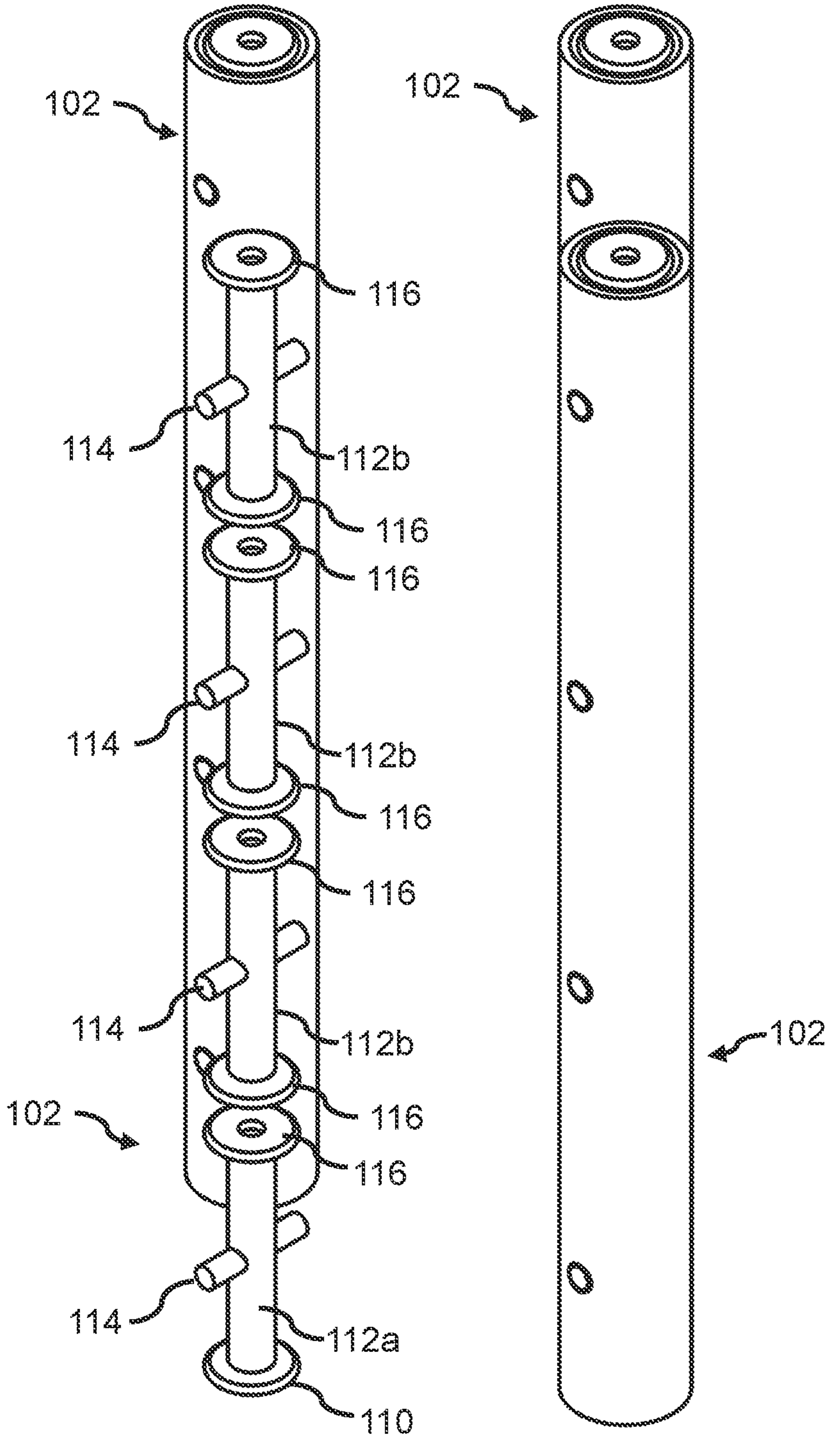
FIG. 3D depicts a perspective view of a piezoelectric transmitter with a radome, transmitter circuit, modulation plate, and a piezoelectric antenna housing which is hidden, in accordance with one or more embodiments of the present disclosure.
Figure 3E:
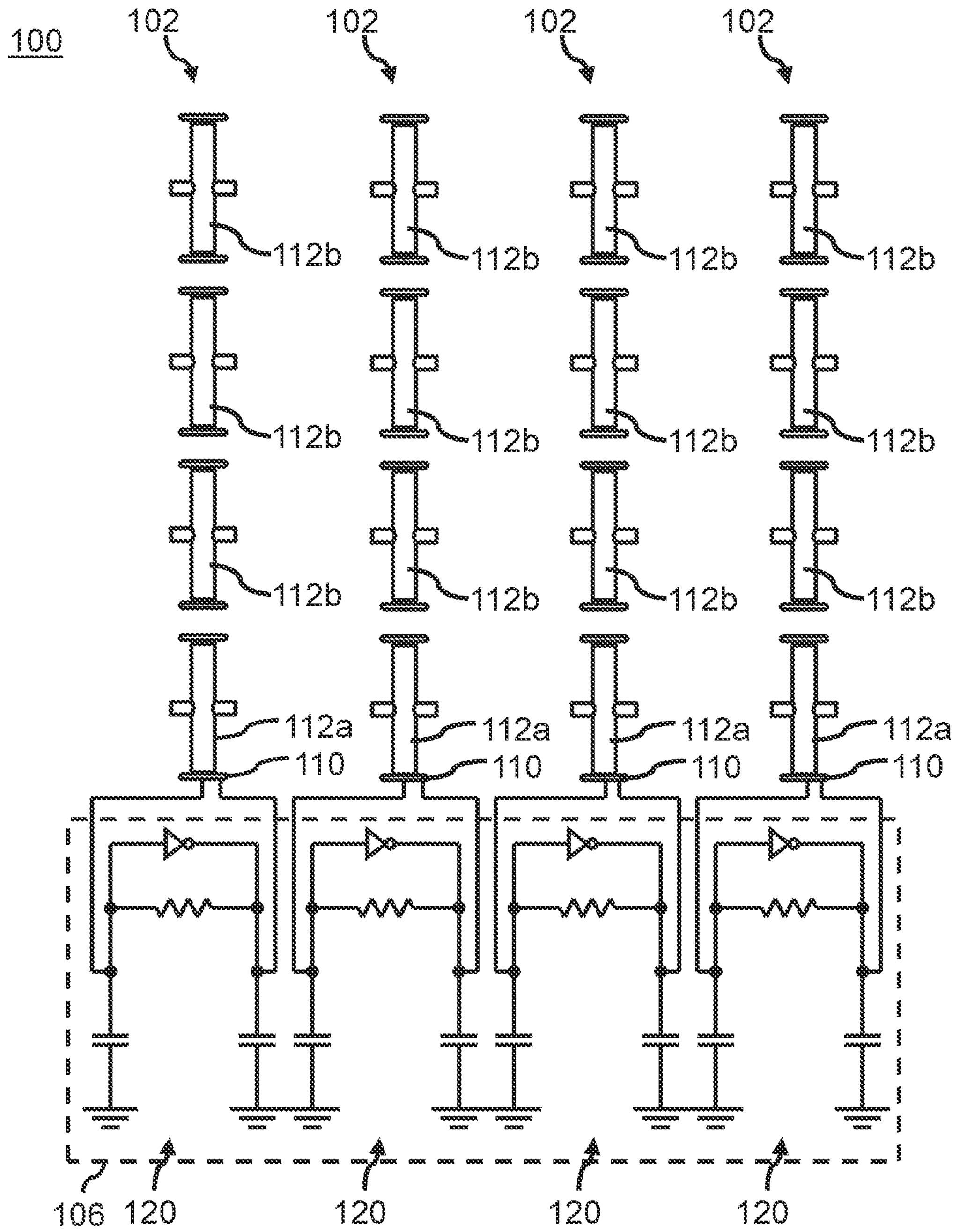
FIG. 3E depicts crystal oscillators formed from piezoelectric antennas and a transmitter circuit of a piezoelectric transmitter, in accordance with one or more embodiments of the present disclosure.

Referring now to FIGS. 2A-2C, the piezoelectric transmitter 100 is described, in accordance with one or more embodiments of the present disclosure. The piezoelectric transmitter 100 may include a plurality of the piezoelectric antennas 102. The piezoelectric antennas 102 may be one of a plurality of the piezoelectric antennas 102 in an array. For example, the piezoelectric antennas 102 may be tiled across a horizontal plane. The piezoelectric antennas 102 may be arranged in a horizontal plane above the modulation plate 104 and/or the transmitter circuit 106. Arranging the piezoelectric antennas 102 in the horizontal plane enables the efficient use of antenna space horizontally across the piezoelectric transmitter 100. The array may enable increasing the power output by the piezoelectric transmitter 100. For example, the piezoelectric antennas 102 may be arrayed to scale the radiated power level of the piezoelectric transmitter 100.

The piezoelectric transmitter 100 may comprise a plurality of crystal oscillators 120. The transmitter circuit 106, the grounded toroids 110, and the piezoelectric elements 112 of the piezoelectric antennas 102 form the plurality of the crystal oscillators 120. For example, the grounded toroids 110 and the piezoelectric elements 112 of the piezoelectric antennas 102 may be on separate crystal oscillators 120. The transmitter circuit 106 may be configured to independently drive the piezoelectric elements 112. The crystal oscillator 120 may match the drive frequency for each of the piezoelectric elements 112 to the resonant frequency of the corresponding element. For example, the crystal oscillator 120 may include a Pierce oscillator for each of the piezoelectric elements 112. The drive frequency for each of the piezoelectric elements 112 may then be measured to determine mismatches in the resonant frequencies (e.g., mismatches due to temperature, capacitance, or the like). The transmitter circuit 106 may adjust the capacitance applied by the modulation plate 104 or another tuning mechanism to each of the piezoelectric elements 112 based on the drive frequency of each of the piezoelectric elements 112. The transmitter circuit 106 may adjust the capacitance until the resonant frequency, the drive frequency, and the radio frequency of the piezoelectric elements 112 are matched across the array.

Although the piezoelectric transmitter 100 is described as including a plurality of crystal oscillators 120, this is not intended as a limitation of the present disclosure. It is contemplated that the one of the piezoelectric elements 112 may be a master element and a remainder of the piezoelectric elements 112 may be slave elements (not depicted). The crystal oscillator 120 may include a drive frequency which is locked to the resonant frequency of the master element. The master element and the slave elements may then be driven at the drive frequency. In this configuration, the frequency of the piezoelectric antennas 102 may not be individually controllable. In this configuration, the crystal oscillator 120 may include a single source to ensure the frequency of the slave elements are matched to the master element.

It is contemplated that the piezoelectric transmitter 100 may include any number of the piezoelectric antennas 102 in an array. For example, the piezoelectric transmitter 100 may include four, eight, or more of the piezoelectric antennas 102 in a circular array.

In embodiments, the transmitter circuit 106 may be configured to perform beam patterning of the electromagnetic field generated by the piezoelectric antennas 102. For example, the transmitter circuit 106 may control a phase of the piezoelectric antennas 102 to perform beam patterning of the electromagnetic field. The transmitter circuit 106 may perform beam patterning of the electromagnetic field generated by the piezoelectric antennas 102 for steering, to create a null, to increase antenna gain in a direction, or the like.

Referring now to FIGS. 3A-3E, the piezoelectric transmitter 100 is described, in accordance with one or more embodiments of the present disclosure. In embodiments, the piezoelectric antennas 102 may include a plurality of the piezoelectric elements 112. The piezoelectric elements 112 may include a driven piezoelectric element 112*a* and parasitic piezoelectric elements 112*b*. The piezoelectric elements 112 (e.g., the driven piezoelectric element 112*a* and parasitic piezoelectric elements 112*b*) may be colinear. For example, the piezoelectric elements 112 may be arranged colinearly along a vertical axis of the piezoelectric antenna 102. In this regard, the piezoelectric elements 112 may be stacked vertically. Where the housing 118 is a cylinder, the arranged colinearly along the central axis of the housing 118. It is contemplated that the piezoelectric antennas 102 may include any integer number of the piezoelectric elements 112 which are arranged colinearly, such as, but not limited to, two, three, four, five, or more of the piezoelectric elements 112.

The transmitter circuit 106 may be configured to directly drive the piezoelectric elements 112 with a voltage. For example, the bottom face 122 of the driven piezoelectric element 112*a* may be driven with the voltage from the transmitter circuit 106. In this regard, the piezoelectric elements 112 may be bottom-fed. A hole in the grounded toroid 110 may enable coupling the driven piezoelectric element 112*a* to the transmitter circuit 106 with a wire through the grounded toroid 110. The driven piezoelectric element 112*a* may be driven directly by the transmitter circuit 106. The driven piezoelectric element 112*a* may be directly driven with voltage from the transmitter circuit 106. The driven piezoelectric element 112*a* may be directly driven with the voltage via a wire between the driven piezoelectric element 112*a* and the transmitter circuit 106 through the hole in the grounded toroid 110. The driven piezoelectric element 112*a* may be driven at a resonant frequency of the driven piezoelectric element 112*a*. The voltage from the transmitter circuit 106 may cause the driven piezoelectric element 112*a* to vibrate. The transmitter circuit 106 may cause the driven piezoelectric element 112*a* to vibrate by applying the voltage with a drive frequency to the driven piezoelectric element 112*a*. Applying the voltage with the drive frequency to the driven piezoelectric element 112*a* may cause the driven piezoelectric element 112*a* to oscillate at the resonant frequency. The feed for the driven piezoelectric element 112*a* may be at the bottom of the piezoelectric antenna 102.

The piezoelectric elements 112 may include one or more parasitic piezoelectric elements 112*b*. The parasitic piezoelectric elements 112*b* may be colinear with the driven piezoelectric elements 112*a*. The parasitic piezoelectric elements 112*b* may capacitively couple to the driven piezoelectric element 112*a*. For example, the parasitic piezoelectric elements 112*b* may capacitively couple to the driven piezoelectric element 112*a* through the gaps between the piezoelectric elements 112. The parasitic piezoelectric elements 112*b* may be excited by the capacitive coupling with the driven piezoelectric element 112*a*. The capacitive coupling may cause the parasitic piezoelectric elements 112*b* to vibrate. The parasitic piezoelectric elements 112*b* may generate an electric field around the parasitic piezoelectric elements 112*b* when vibrated. Thus, the transmitter circuit 106 may excite the piezoelectric elements 112 by driving the driven piezoelectric element 112*a* and capacitively coupling the driven piezoelectric element 112*a* to the parasitic piezoelectric elements 112*b*.

In embodiments, the parasitic piezoelectric elements 112*b* may not be coupled to the transmitter circuit 106. The piezoelectric antennas 102 may not include wires directly coupling the parasitic piezoelectric elements 112*b* with the transmitter circuit 106. Not including wires directly coupling the parasitic piezoelectric elements 112*b* with the transmitter circuit 106 may be desirable. Removing the wires to the parasitic piezoelectric elements 112*b* may be desirable to prevent electric fields generated by the piezoelectric elements 112 from coupling into the wires and reducing the radiation performance of the piezoelectric antennas 102. For example, the wires may absorb a portion of the electromagnetic field generated by the piezoelectric elements 112 which are parallel with the wire due to an inductive coupling. The electromagnetic field may induce a current in the wires, thereby reducing the electromagnetic field. The capacitive coupling between the driven piezoelectric element 112*a* and the parasitic piezoelectric elements 112*b* may be desirable to remove the need for wires directly coupling the parasitic piezoelectric elements 112*b* and the transmitter circuit 106.

The voltage from the transmitter circuit 106 may cause the piezoelectric elements 112 (e.g., the driven piezoelectric element 112*a* and the parasitic piezoelectric elements 112*b*) to vibrate. The transmitter circuit 106 may cause the piezoelectric elements 112 to vibrate by applying the voltage with a drive frequency to the driven piezoelectric element 112*a*. Applying the voltage with the drive frequency to the driven piezoelectric element 112*a* may cause the piezoelectric elements 112 to oscillate at the resonant frequency.

The driven piezoelectric element 112*a* and the parasitic piezoelectric elements 112*b* may vibrate in synchronization.

For example, driven piezoelectric element 112*a* and the parasitic piezoelectric elements 112*b* may vibrate in synchronization at an even mode frequency. The even mode frequency may refer to a frequency when each of the driven piezoelectric element 112*a* and the parasitic piezoelectric elements 112*b* vibrate with the even mode. The even mode frequency may be close to the resonant frequency of a driven piezoelectric elements 112*a* when not capacitively coupled the parasitic piezoelectric elements 112*b*. Capacitively coupling the parasitic piezoelectric elements 112*b* to the driven piezoelectric element 112*a* may cause a small change the resonant frequency of the driven piezoelectric element 112*a*. The resonant frequency of the driven piezoelectric element 112*a* when not capacitively coupled to the parasitic piezoelectric elements 112*b* may be referred to as a single element resonant frequency. The even mode frequency may be within one percent of the single element resonant frequency. Thus, the parasitic piezoelectric elements 112*b* may have a minimal impact on the radio frequency of the electromagnetic field generated by the piezoelectric antennas 102.

The driven piezoelectric element 112*a* and the parasitic piezoelectric elements 112*b* may vibrate in synchronization so that the driven piezoelectric element 112*a* and the parasitic piezoelectric elements 112*b* generate electromagnetic fields which are in phase. The electromagnetic fields from the driven piezoelectric element 112*a* and the parasitic piezoelectric elements 112*b* may then constructively interfere to increase the power of the electromagnetic fields.

The insulating supports 114 may be coupled to a midpoint of the piezoelectric elements 112 (e.g., to midpoints of the driven piezoelectric elements 112*a* and the parasitic piezoelectric elements 112*b*).

The driven piezoelectric element 112*a* and the parasitic piezoelectric elements 112*b* may form a colinear dipole. For example, the electromagnetic fields generated by the driven piezoelectric element 112*a* and the parasitic piezoelectric elements 112*b* may combine to form a dipole. The driven piezoelectric element 112*a* and the parasitic piezoelectric elements 112*b* may combine to form the dipole within the near-field (e.g., the radiative near-field) of the piezoelectric antenna 102. For instance, the electromagnetic fields generated by the driven piezoelectric element 112*a* and the parasitic piezoelectric elements 112*b* may be a dipole after several meters from the piezoelectric antenna 102. The driven piezoelectric element 112*a* and the parasitic piezoelectric elements 112*b* may be tightly coupled together and may not be resolved separately. The electromagnetic fields generated by the driven piezoelectric element 112*a* and the parasitic piezoelectric elements 112*b* may or may not appear as a dipole within the reactive near-field of the piezoelectric antenna 102.

The parasitic piezoelectric elements 112*b* may increase the power of the piezoelectric antennas 102. For example, the power of the piezoelectric antennas 102 scale may be proportional to the number of the piezoelectric elements 112. It is noted that the power of the piezoelectric antennas 102 may not scale linearly with the number of the piezoelectric elements 112 due to losses. Furthermore, the power scaling provided by increasing the number of piezoelectric elements 112 may decrease as more of the piezoelectric elements 112 are added to the piezoelectric antennas 102. For example, the piezoelectric antennas 102 with four of the piezoelectric elements 112 (e.g., one of the driven piezoelectric elements 112*a* and three of the parasitic piezoelectric elements 112*b*) may increase the power of the piezoelectric antennas 102 by 3.8 times more than the piezoelectric antennas 102 with only one of the piezoelectric elements 112. By way of another example, the piezoelectric antennas 102 with five of the piezoelectric elements 112 (e.g., one of the driven piezoelectric elements 112*a* and four of the parasitic piezoelectric elements 112*b*) may increase the power of the piezoelectric antennas 102 by between 4.2 and 4.3 times more than the piezoelectric antennas 102 with only one of the piezoelectric elements 112. The piezoelectric antennas 102 may include an element count limit, where increasing the number of the parasitic piezoelectric elements 112*b* above the element count limit decreases the power. The element count limit may bound the upper number of the piezoelectric elements 112 to which each of the piezoelectric antennas 102 may include. The element count limit may bound the upper limit of the parasitic piezoelectric 112*b-r* to which the piezoelectric antenna 102 may include.

In embodiments, the field-shaping toroids 116 may be disposed between the driven piezoelectric element 112*a* and the parasitic piezoelectric elements 112*b*. For example, pairs of the field-shaping toroids 116 may be disposed between the driven piezoelectric element 112*a* and the parasitic piezoelectric elements 112*b*. The field-shaping toroids 116 between the driven piezoelectric element 112*a* and the parasitic piezoelectric elements 112*b* may capacitively couple the driven piezoelectric element 112*a* and the parasitic piezoelectric elements 112*b* through the field-shaping toroids 116.

In embodiments, the transmitter circuit 106, the grounded toroid 110, and the driven piezoelectric element 112*a*, may form the crystal oscillators 120. For example, the crystal oscillators 120 may be locked to the resonant frequency of the driven piezoelectric elements 112*a*. The driven piezoelectric elements 112*a* may then be driven with voltage from the crystal oscillators 120.

Figure 4:
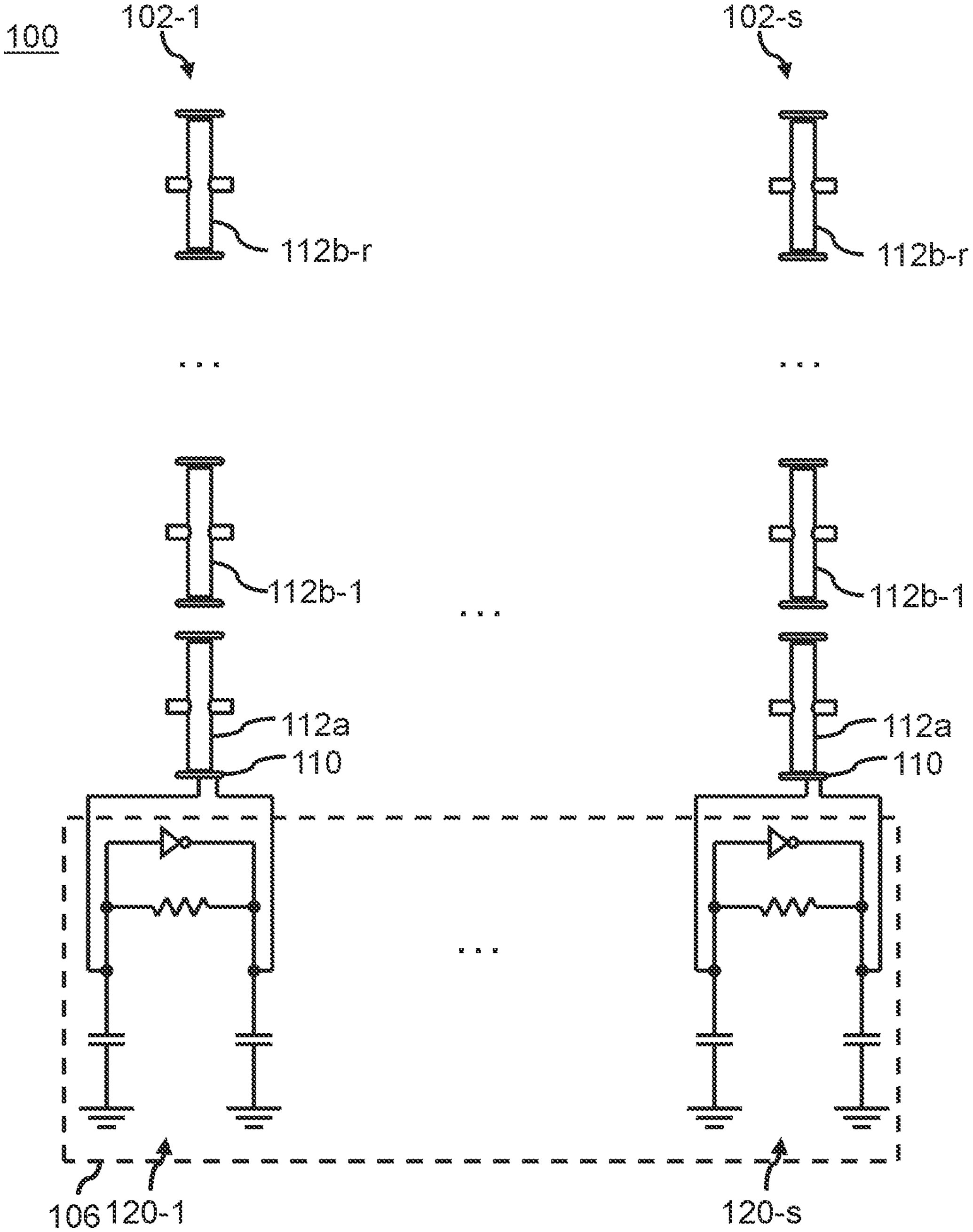
FIG. 4 depicts crystal oscillators formed from piezoelectric antennas and a transmitter circuit of a piezoelectric transmitter, in accordance with one or more embodiments of the present disclosure.

Referring now to FIG. 4, the piezoelectric transmitter 100 is described, in accordance with one or more embodiments of the present disclosure. The piezoelectric antenna 102 may include any number of the parasitic piezoelectric elements 112-1 through 112*b-r*, where r is an integer. The piezoelectric transmitter 100 may include any number of the piezoelectric antennas 102-1 through 102-*s*, where s is an integer. The piezoelectric transmitter 100 may include any number of the crystal oscillators 120-1 through 120-*s* formed from each of the respective of the piezoelectric antennas 102-1 through 102-*s*.

Referring generally again to the figures.

The piezoelectric antennas may improve operation of antenna systems by enabling operation in the VLF or LF spectra. This can allow radio transmissions in critical or previously impossible implementations, such as after a nuclear explosion, through seawater, or through solid rock, due to the advantageous low propagation losses of VLF or ULF signals. As will be appreciated from the above, the piezoelectric antennas may enable VLF and LF transmissions in a more practical form factor than existing trailing antenna systems The piezoelectric antennas disclosed herein can enable mobile or portable applications needed to achieve VLF or LF transmission frequencies. The piezoelectric antennas can be utilized in several applications such as stationary antennae, ground-based antennae, underwater transmissions, and transmissions through solid rock, and the like.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mixable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A piezoelectric transmitter comprising:

a piezoelectric antenna comprising:

a piezoelectric element;

a grounded toroid;

an insulating support; wherein the insulating support is coupled to a midpoint of the piezoelectric element; and a field-shaping toroid; and a transmitter circuit; wherein the transmitter circuit is configured to directly drive the piezoelectric element with a voltage; wherein the piezoelectric element is configured to capacitively couple to the grounded toroid and the field-shaping toroid; wherein the voltage from the transmitter circuit causes the piezoelectric element to vibrate with a longitudinal mode; wherein the piezoelectric element couples vibration into an electromagnetic field with a radio frequency;

wherein the transmitter circuit, the grounded toroid, and the piezoelectric element form a crystal oscillator; wherein the crystal oscillator comprises a drive frequency which is locked to a resonant frequency of the piezoelectric element; wherein the crystal oscillator comprises a Pierce oscillator; wherein the Pierce oscillator comprises a digital inverter, a resistor, a first capacitor, a second capacitor, the grounded toroid, and the piezoelectric element; wherein the digital inverter, the resistor, and the piezoelectric element in series with the grounded toroid are coupled in parallel between the first capacitor and the second capacitor.

2. The piezoelectric transmitter of claim 1, wherein the grounded toroid is ground to the transmitter circuit; wherein the field-shaping toroid is a floating ground which is not ground to the transmitter circuit.

3. The piezoelectric transmitter of claim 1, wherein the grounded toroid and the field-shaping toroid are separated from a bottom face and a top face of the piezoelectric element, respectively; wherein the bottom face is directly driven with the voltage; wherein the bottom face is configured to capacitively couple to the grounded toroid; wherein the top face is configured to capacitively couple to the field-shaping toroid.

4. The piezoelectric transmitter of claim 3, wherein the bottom face and the top face are metallized.

5. The piezoelectric transmitter of claim 1, wherein the radio frequency is in a VLF band.

6. The piezoelectric transmitter of claim 5, the piezoelectric antenna comprising a housing; wherein the housing supports the grounded toroid, the piezoelectric element, the insulating support, and the field-shaping toroid.

7. The piezoelectric transmitter of claim 6, comprising a radome; wherein the radome surrounds the piezoelectric antenna; wherein the radome and the housing are transmissive to the radio frequency.

8. The piezoelectric transmitter of claim 1, wherein the midpoint is an anti-node in the vibration of the piezoelectric element.

9. The piezoelectric transmitter of claim 1, wherein the transmitter circuit is configured to measure the drive frequency and determine the radio frequency based on the drive frequency.

10. The piezoelectric transmitter of claim 9, comprising a modulation plate; wherein the piezoelectric element and the grounded toroid capacitively couple to the modulation plate; wherein the transmitter circuit is configured to adjust a capacitance between the piezoelectric element and the modulation plate based on the drive frequency measured by the transmitter circuit to tune the resonant frequency, the drive frequency, and the radio frequency.

11. The piezoelectric transmitter of claim 1, wherein the piezoelectric antenna is one of a plurality of piezoelectric antennas in an array; wherein the piezoelectric transmitter comprises the plurality of piezoelectric antennas.

12. The piezoelectric transmitter of claim 11, wherein the crystal oscillator is one of a plurality of crystal oscillators; wherein the piezoelectric transmitter comprises the plurality of crystal oscillators.

* * * * *